United States Patent
Takanashi et al.

(10) Patent No.: US 9,284,660 B2
(45) Date of Patent: Mar. 15, 2016

(54) APPARATUS OF PRODUCING SILICON SINGLE CRYSTAL AND METHOD OF PRODUCING SILICON SINGLE CRYSTAL

(75) Inventors: Keiichi Takanashi, Tokyo (JP); Ken Hamada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1132 days.

(21) Appl. No.: 13/314,503

(22) Filed: Dec. 8, 2011

(65) Prior Publication Data
US 2012/0145068 A1   Jun. 14, 2012

(30) Foreign Application Priority Data
Dec. 13, 2010   (JP) .................................. 2010-277212

(51) Int. Cl.
C30B 29/06   (2006.01)
C30B 15/26   (2006.01)

(52) U.S. Cl.
CPC .................. C30B 29/06 (2013.01); C30B 15/26 (2013.01); *Y10T 117/1008* (2015.01)

(58) Field of Classification Search
CPC combination set(s) only.
See application file for complete search history.

(56) References Cited

U.S. PATENT DOCUMENTS

| | | | |
|---|---|---|---|
| 4,915,775 A | 4/1990 | Katsuoka et al. | |
| 5,656,078 A * | 8/1997 | Fuerhoff | 117/201 |
| 6,171,391 B1 * | 1/2001 | Fuerhoff et al. | 117/14 |
| 2007/0017435 A1 * | 1/2007 | Takanashi | 117/14 |
| 2010/0175611 A1 * | 7/2010 | Takanashi | 117/15 |

FOREIGN PATENT DOCUMENTS

| | | |
|---|---|---|
| JP | 3-31673 | 5/1991 |
| JP | 5-59876 | 9/1993 |
| JP | 2007-031175 | 2/2007 |
| JP | 2010-163297 | 7/2010 |

OTHER PUBLICATIONS

Japanese Office action dated Jul. 29, 2014, along with an English-language translation thereof.

* cited by examiner

*Primary Examiner* — Duy Deo
*Assistant Examiner* — Erin Bergner
(74) *Attorney, Agent, or Firm* — Greenblum & Bernstein, P.L.C.

(57) ABSTRACT

An apparatus of producing a silicon single crystal including: an imaging device; a heat shield that has a circular opening; a first operation unit that operates the imaging device and takes a real image of the heat shield and a mirror image of the heat shield reflected on a surface of the silicon melt, measures a spacing between the real image and the mirror image, and calculates a position of a melt-surface; a second operating unit that operates the imaging device and takes an image of a bright-zone in the vicinity of the solid-liquid interface, and calculates a position of the melt-surface based on the image of the bright zone; and a controlling unit that refers a data of the position of the silicon melt obtained by the first operation unit and the second operation unit, and controls the position of the silicon melt.

6 Claims, 11 Drawing Sheets

APPARATUS OF PRODUCING SILICON SINGLE CRYSTAL AND METHOD OF PRODUCING SILICON SINGLE CRYSTAL

BACKGROUND OF THE INVENTION

1. Field of the Invention

The present invention relates to an apparatus of producing a silicon single crystal and a method for producing a silicon single crystal that can provide high-quality silicon single crystals having designated crystal properties based on critical control of surface position of silicon melt during pulling the silicon single crystals from the silicon melt by the Czochralski method.

Priority is claimed on Japanese Patent Application No. 2010-277212, filed Dec. 13, 2010, the content of which is incorporated herein by reference.

2. Description of Related Art

Conventionally, silicon single crystals have been produced through various methods. The Czochralski method (hereafter referred to as CZ method) is the most representative method for producing silicon single crystals. In the growth process of a silicon single crystal by the CZ method, a silicon melt is formed by melting polysilicon in a crucible. Then, a seed crystal is dipped in the silicon melt and is pulled up with a predetermined pulling speed while rotating the seed crystal with a predetermined rotation rate. As a result, a silicon single crystal of columnar shape is grown below the seed crystal.

In a silicon single crystal grown by the CZ method, species and distribution of the defects depend on the ratio of the pulling rate V of the silicon single crystal and thermal gradient G in the silicon single crystal along the growth direction. The ratio is hereafter referred to as V/G.

Under large V/G conditions, the silicon single crystal is in excess of vacancies, resulting in generation of small voids (defects generally called COPs) as agglomerates of the vacancies are formed in the crystal. On the other hand, under small V/G conditions, the silicon single crystal is in excess of interstitial silicon atoms, resulting in generation of dislocation clusters as agglomerates of the interstitial silicon atoms. Therefore, in order to grow a crystal that does not include COPs and dislocation clusters, it is necessary to control the radial distribution and axial distribution of V/G in an appropriate range.

With respect to the radial distribution, pulling rate V is constant in any positions along the radial direction in the single crystal. Therefore, it is necessary to design a structure of high temperature zone (hot zone) in the CZ furnace such that the thermal gradient G is within a predetermined range. With respect to axial distribution, G depends on the pull length of the single crystal. Therefore, it is necessary to change V along the lengthwise direction of the single crystal so as to control V/G in a predetermined range.

Currently, mass production of COP-free and dislocation clusters-free crystals is realized even in production of silicon single crystals of 300 mm in diameter based on the control of V/G.

However, even though a silicon single crystal that does not include COPs and dislocation clusters is grown by controlling V/G, a silicon wafer obtained from the crystal does not have a homogeneous property throughout the wafer plane, but includes a plurality of regions that exhibits different behaviors under a heat treatment. For example, when V/G is varied from COP generation conditions to dislocation cluster generation conditions, three regions consisting of so called OSF region, Pv region, and Pi region appear with decreasing V/G between the COP generation region and the dislocation cluster generation region.

The OSF region denotes a region which includes platy oxygen precipitates (OSF nuclei) under an as-grown state (a state at which the single crystal is not subjected to any heat treatment after the growth of the crystal) and generates OSFs (Oxidation Induced Stacking Faults) when the crystal is subjected to thermal oxidation. A Pv region denotes a region that includes oxygen precipitation nuclei under an as-grown state and easily generates oxygen precipitates when the crystal is subjected to two step heat treatment at low temperature and high temperature (for example, at 800° C. and 1000° C.). A Pi region denotes a region that is almost free of oxygen precipitation nuclei under an as-grown state and hardly generates oxygen precipitates even when the crystal is subjected to heat treatment.

There is a demand to provide high-quality silicon single crystal in which the above-described Pv region and the Pi region are formed as distinguishable regions (hereafter, such crystal is referred to as a PvPi crystal). It is revealed that precise control of V/G is required to grow a PvPi crystal. For example, it is necessary to control the fluctuation of V/G within a range of ±0.5% during the growth of a PvPi crystal.

In general, V/G is controlled by controlling the pulling rate V. With regard to control of V/G, it is known that thermal gradient G during pulling the silicon single crystal is largely affected by a distance (spacing) between the melt surface of the silicon melt and the heat-shield that is disposed to face the melt surface. In order to control the V/G to be in the growth conditions of a designated defect-free region, it is necessary that the distance between the melt surface and the heat-shield remain constant. On the other hand, it is necessary to lift up the crucible since the amount of the melt decreases in accordance with the progressive pulling of the silicon single crystal.

Conventionally, a volumetric loss of silicon melt as a result of pulling a silicon single crystal was calculated, and elevation of the crucible was calculated based on the volumetric loss of the silicon melt and the inner diameter of the crucible. However, it is difficult to calculate the loss of silicon melt precisely because of a change of dimension of the crucible due to deformation of the crucible at high temperature and because of error of measurement of the inner diameter of the crucible. Therefore, relative position of the melt surface and the heater is not stable. Therefore, in order to produce silicon single crystals having designated defect region by controlling V/G, it is necessary to measure a position of the surface of the silicon melt precisely during pulling of the silicon single crystal, and control the elevation of the crucible based on the measured value.

As an example of a method for precisely measuring the surface position (surface level) of the silicon melt, Japanese Examined Patent Application, Second Publication No. H3-31673 (Japanese Patent No. 1676655) describes the following method. A rod made of a refractory material such as quartz is attached to the heat-shield that covers the silicon melt such that the rod is attached to end portion facing the silicon melt. The position of the surface of the silicon melt (hereafter, referred to as melt-surface position) is determined by detecting the contact of the rod with the melt-surface.

As an alternative example, in the method described in Japanese Examined Patent Application, Second Publication No. H5-59876 (Japanese Patent No. 2132013), contact of the seed crystal and the melt surface is detected, and the surface level of the melt is determined relative to the contact position.

However, in the above-explained conventional methods, it has been difficult to detect the precise position of the melt surface at the time of starting the crystal pulling because of irregular lengths of seed crystals, fluctuation of melt-surface due to rotation of the crucible or the like. In addition, it is impossible to detect the position of the melt surface in real time during the pulling process.

In order to solve the above-described problems, an object of the present invention is to provide a method for producing a silicon single crystal and an apparatus of producing a silicon single crystal that enable production of silicon single crystals of high quality while detecting precise surface position of the silicon melt throughout the pulling process of the silicon single crystal including starting of the pulling and intermediate stage during continuing the crystal pulling.

SUMMARY OF THE INVENTION

A first aspect of the present invention is an apparatus of producing a silicon single crystal by pulling a silicon single crystal from a silicon melt formed in a crucible, including:

an imaging device that takes an image of a region including a surface of the silicon melt from a direction that is inclined with a predetermined angle about a pulling axis of the silicon single crystal;

a heat shield that is disposed so as to cover a partial surface of the silicon melt and that has a circular opening through which the silicon single crystal during pulling penetrates the heat shield;

a first operation unit (first computing unit) that operates the imaging device and takes (detects) a real image of the heat shield including the opening and a mirror image of the heat shield reflected on the surface of the silicon melt, measures a spacing between the real image and the mirror image, and calculates a position (level) of the surface of the melt;

a second operating unit (a second computing unit) that operates the imaging device and takes an image of a bright-zone (fusion ring) that appears in the vicinity of interface between the silicon melt and the silicon single crystal, and calculates a position of the silicon melt based on the center position of the silicon single crystal that is determined based on the image of the bright zone; and a controlling unit that refers to a data of the position of the silicon melt obtained by the first operation unit and a data of the position of the silicon melt obtained by the second operation unit, and controls the position of the silicon melt at the time of pulling the silicon single crystal.

An apparent image of the opening of the heat shield obtained by the imaging device has an elliptic shape. The first operation unit may calculate the center position of the heat shield through circular approximation of the elliptic apparent image of the opening.

The first operation unit may determine contours (e.g., inner contour that defines the shape of the opening) of the real image and the mirror image of the heat shield based on differential information (e.g., differential data of brightness) of the real image and the mirror image taken by the imaging device.

The first operation unit may perform transformation to project the contours of the real image and the mirror image of the heat shield obtained by the imaging device to a plane corresponding to the lower end position of the heat shield.

The first operation unit may select a contour from the contours of each of the real image and the mirror image obtained by the imaging device such that the selected contour encloses an area of not smaller than a predetermined area and use the selected contour in calculation of the center position of the heat shield.

The imaging device may take an image from a direction inclined from the vertical direction by an angle such that a deviation between the contours (e.g., outlines of the opening) of the real image and the mirror image of the heat shield and the circular approximated image of the opening of the heat shield is minimized.

In the initial stage (beginning) of pulling a silicon single crystal, the first operation unit may perform setting of the position (surface position) of the surface of the silicon melt based on the spacing between the real image and the mirror image of the heat shield.

From the end on the initial stage to the stage where a diameter of the silicon single crystal reaches a predetermined value, the first operation unit may control the position of the surface of silicon melt through the controlling unit based on the spacing between the real image and the mirror image of the heat shield.

In the stage after the diameter of the silicon single crystal reaching the predetermined value, the second operation unit may control the position of the surface of the silicon melt through the controlling unit based on the center position of the silicon single crystal determined from the image of the bright zone.

At the timing when the diameter of the silicon single crystal reaches the predetermined value, it is preferable to perform correction (calibration) of difference between the position of the surface of the silicon melt determined by the first operation unit and the position of the surface of the silicon melt determined by the second operation unit.

A method of producing a silicon single crystal according to the present invention includes pulling a silicon single crystal from a silicon melt formed in a crucible, the method including: performing a first operation including taking a real image of the heat shield including a circular opening and a mirror image of the heat shield reflected on the surface of the silicon melt, measuring the spacing between the real image and the mirror image, and calculating the position of the surface of the silicon melt; performing a second operation including taking an image of a bright zone that appears in the vicinity of the interface between the silicon melt and the silicon single crystal, and calculating the position of the surface of the silicon melt based on a center position of the silicon single crystal determined from the image of the bright zone; and controlling the position of the surface of the silicon melt in the time of pulling the silicon single crystal while referring to data of the position of the surface of the silicon melt obtained by the first operation and data of the position of the surface of the silicon melt obtained by the second operation.

According to the above-described apparatus of producing a silicon single crystal, the surface position of the silicon melt in the initial stage of pulling may be set by the first operation unit based on the spacing between the real image and the mirror image of the heat shield. At the stage where the diameter of the silicon single crystal reaches a predetermined diameter and pulling of the straight body portion starts, operation unit may be switched from the first operation unit to the second operation unit. Then, the surface position of the silicon melt is set based on the image of the bright zone (fusion ring).

By this configuration, it is possible to control the surface position of the silicon melt at high accuracy such that V/G is controlled in the range for obtaining a desired defect-free region from the time of dipping the seed crystal in the silicon melt to the end of pulling the whole length of the silicon single crystal. Therefore, high-quality silicon single crystals including defect-free region can be provided stably with high yield.

According to the above-described method of producing a silicon single crystal, surface position of the silicon melt is set based on the spacing between the real image and the mirror image of the heat shield in the initial stage of crystal pulling. After a predetermined pulling stage has passed, setting of the surface position of the silicon melt is performed based on the image of bright zone (fusion ring). By this method, it is possible to control the position of the surface of the silicon melt at high accuracy such that V/G is controlled in the range for obtaining a desired defect-free region. Therefore, high-quality silicon single crystals including defect-free regions can be provided stably with high yield.

DETAILED DESCRIPTION OF THE INVENTION

Figure 1:
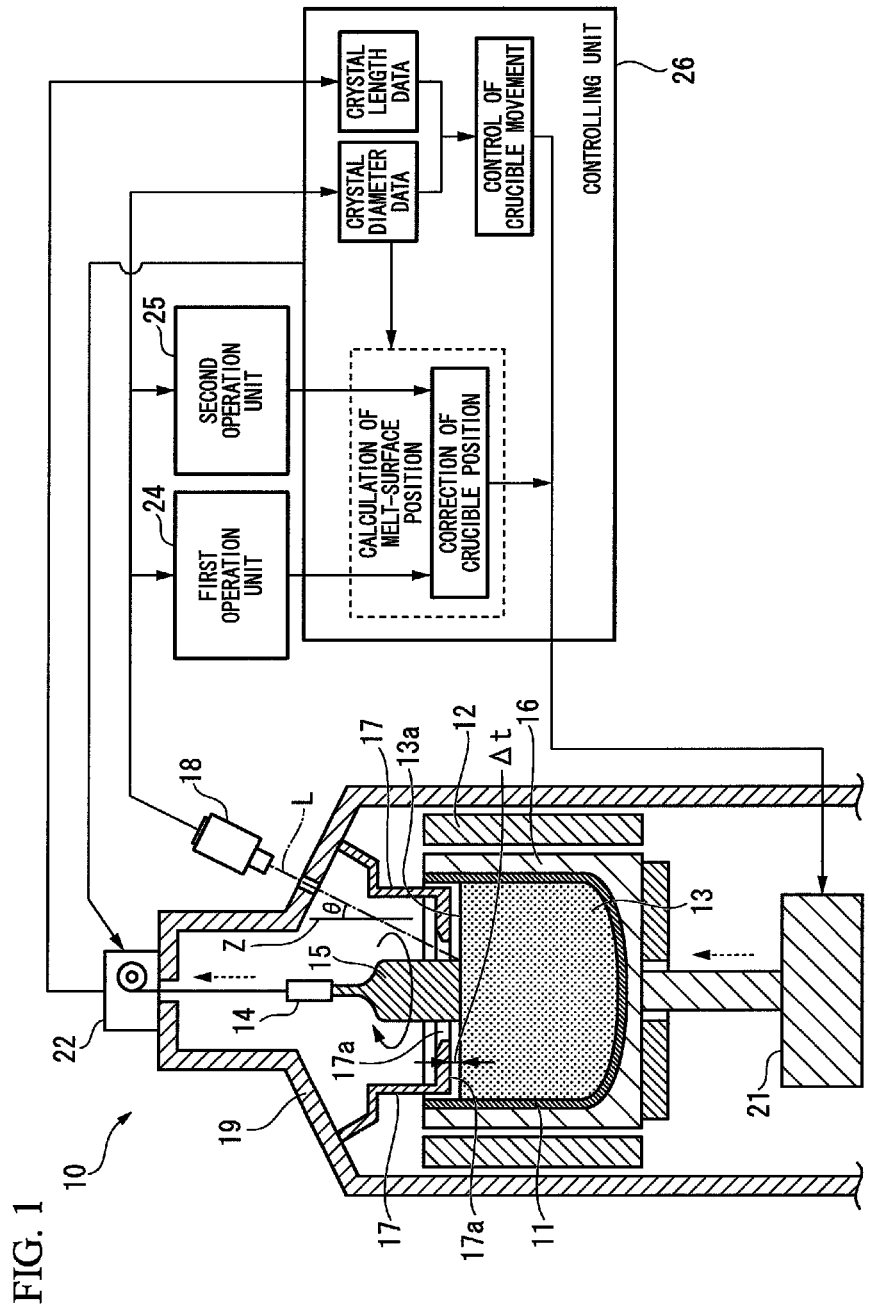
FIG. 1 is a schematic diagram showing an embodiment of an apparatus of producing a silicon single crystal.

In the following, an embodiment of an apparatus of producing a silicon single crystal and a method of producing a silicon single crystal according to the present invention will be explained with reference to the drawings. The below described embodiment is an exemplary embodiment for describing the scope of the present invention and, without specific mention, does not limit the present invention. In the drawings used in the below explanation, main parts are occasionally magnified for the sake of convenience in explanation. Therefore, the size ratio of constituents shown in the drawing does not always correspond to the practical size ratio.

FIG. 1 is a schematic vertical cross section that shows an example of an apparatus of producing a silicon single crystal according to an embodiment of the present invention. The apparatus 10 for pulling a silicon single crystal (producing a silicon single crystal) includes a substantially cylindrical chamber 19, and a quartz crucible 11 is housed in the chamber 19. Silicon melt is formed and stored in the quartz crucible 11. The chamber 19 may have a dual wall structure with a predetermined interstices between the inner wall and the outer wall. By flowing water in the interstices, the chamber 19 escapes from being heated to high temperature during heating of the quartz crucible 11.

In the time of pulling a silicon single crystal, inert gas such as argon is introduced into the chamber 19. A pulling device 22 is disposed on the top of the chamber 19. The pulling device 22 pulls up the seed crystal 14 as a growth nuclei of a silicon single crystal ingot 15 and the silicon single crystal ingot 15 grown beneath the seed crystal 14 while rotating the seed crystal 14 and the silicon single crystal ingot 15. A sensor (not shown) may be equipped to the pulling device 22 to transmit information on the length of the silicon single crystal ingot 15 based on the amount of pulling the silicon single crystal ingot 15.

A side heater 12 of substantially cylindrical shape is disposed inside the chamber 19. The side heater 12 heats the quartz crucible 11. The quartz crucible 11 and the crucible support body (graphite crucible) 16 are installed in the space surrounded by the side heater 12. The quartz crucible 11 has a solid body container made of quartz and has a substantially cylindrical shape having a bottom and an opening on the upper side.

Silicon melt 13 formed by melting solid silicon is stored in the quartz crucible 11. The crucible support body 16 is made of, e.g., graphite, and supports the quartz crucible 11 while closely enveloping the quartz crucible 11. The crucible support body 16 has a role of maintaining a shape of the quartz crucible 11 which is softened in the time of melting silicon, and has a role of supporting the quartz crucible 11.

A crucible support device (lift) 21 is disposed below the crucible support body 16. The crucible support device 21 supports the crucible support body 16 and the quartz crucible 11 from lower side and drives the quartz crucible 11 up and down in correspondence with the position of the melt surface 13a of the silicon melt 13 that changes in accordance with pulling of the silicon single crystal ingot 15. Thus, the position of the melt surface 13a of the silicon melt 13 is controlled.

A heat shield (heat shield cylinder) 17 is disposed above the quartz crucible 11 so as to cover the upper surface, that is, melt surface 13a of the silicon melt 13. The heat shield 17 is made of, for example, bowl shaped or cone shaped heat insulating plate. The silicon single crystal 15 under pulling penetrates an opening in the bottom part of the heat shield 17. For example, a circular opening 17a is formed in the heat shield 17. The heat shield 17 may be fixed to the inner wall of the chamber 19.

The heat shield 17 protects the silicon single crystal ingot 15 being pulled from deterioration of quality caused by influence on thermal history of the crystal due to radiation heat from the silicon melt 13.

In addition, the heat shield 17 guides the inert gas such as argon filled in the interior of the apparatus 10 of pulling silicon single crystal towards the silicon melt 13, thereby controlling amount of residual oxygen in the melt surface 13a of the silicon melt 13, and silicon vapor evaporated from the silicon melt 13 such that the silicon single crystal ingot 15 is given a target quality.

So as to ensure a target quality of the silicon single crystal ingot 15, it is necessary to set a spacing (gap) Δt between the bottom (e.g., bottom opening 17a) of the heat shield 17 and the melt surface 13a of the silicon melt 13 with a high level of accuracy.

An imaging device 18 is disposed outside the chamber 19. For example, the imaging device may be constituted of a CCD camera. Through the window 19a formed in the chamber 19, the imaging device 18 takes an image of a space in the vicinity of upper portion of the quartz crucible 11, where the imaged space includes the circular opening 17a of the heat shield 17 (shield cylinder). Optical axis L of the imaging device 18 is inclined about the pulling axis 15 of the silicon single crystal ingot 15 by a predetermined angle of θ.

That is, from the beginning of pulling through the continuous pulling process, the imaging device 18 takes images of the space including the heat shield 17 in the vicinity of the upper portion of the quartz crucible from a direction inclined about the pulling direction of the silicon single crystal ingot 15.

The imaging device 18 is connected to a first operation unit 24, a second operation unit 25, and a controlling unit 26. The first operation unit 24, the second operation unit 25, and the pulling unit 22 are connected to the controlling unit 26. The controlling unit 26 controls the movement (elevation) of the quartz crucible 11 based on the data of crystal length of the silicon single crystal ingot 15 provided by the sensor of the pulling unit 22 and the data of crystal length obtained by the imaging device 18.

In the control of the movement of the quartz crucible 11, position of the quartz crucible 11 is adjusted based on position-correction data calculated by the first operation unit 24 and/or the second operation unit 25. In the following, constitutions and functions of the first operation unit 24 and the second operation unit 25 will be explained in detail.

In the first operation unit 24, surface-position of the silicon melt 13 is calculated based on the image taken by the imaging device 18, where the image includes a real image of the heat shield (shield cylinder) 17, and mirror image of the heat shield 17 reflected on the melt surface 13a of the silicon melt 13.

Figure 2:
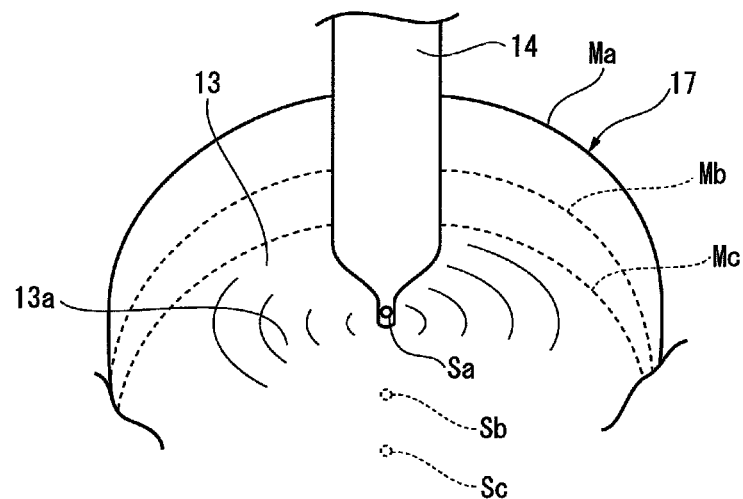
FIG. 2 is a drawing for explaining setting of the position of a melt-surface by the first operation unit.

As illustrated in FIG. 2, the melt surface 13a of the silicon melt 13 constitutes a mirror surface. Therefore, the heat shield (shield cylinder) 17 is reflected on the melt surface 13a as a mirror image. The heat shield 17 is fixed to, for example, chamber 19, and does not move even when the silicon melt 13 moves in accordance with vertical movement of the quartz crucible 11. A mirror image of the heat shield 17 is formed on the melt surface 13a. As an alternative to fixing the heat shield directly to the inner surface of the chamber 19, the heat shield 17 may be fixed to the other member disposed inside the chamber 19.

When the position of the melt surface 13a is moved up and down by moving the quartz crucible 11 vertically up and down, spacing between the real image of the heat shield 17 and the mirror image of the heat shield 17 reflected on the melt surface 13a changes in accordance with the movement of the melt surface 13a. The spacing between the real image and the mirror image is proportional to the amount of vertical movement of the melt surface 13a. In other words, the spacing between the heat shield 17 and a dummy heat shield that is mirror symmetric to the real heat shield 17 is proportional to the amount of vertical movement of the melt surface 13a.

Where the image is taken by the imaging device 18 from upper-side of the quartz crucible 11, and spacing between the real image and the mirror image of the heat shield 17 is calculated form the data of the image, the calculated spacing, for example, shown by pixel numbers of the image, has a one-to-one correspondence to the amount of vertical movement of the melt surface 13 caused by vertical movement of the quartz crucible driven by the crucible support device (lift) 21. In many cases, a graph of this correspondence can be approximated with a quadratic or higher order curve.

Therefore, a position of the melt surface 13a can be specified utilizing the real image and the mirror image of the heat shield 17. The spacing between the real image and the mirror image (the mirror image reflected on the melt surface 13a) of the heat shield 17 is changed by vertical movement of the melt surface 13a. The changing spacing is measured at a plurality of positions so as to specify correspondence between the position of the melt surface 13a and the spacing between the real image and the mirror image. Thus, it is possible to specify the position of the melt surface 13a relative to the reference position where the spacing between the real image and the mirror image of the heat shield is zero.

For example, where the spacing between the real image and the mirror image of the heat shield 17 at an initial position of melt surface 13a is preliminary specified in the image data of the imaging device 18, it is possible to control the melt surface 13a to have the initial position by vertically moving the melt surface 13a in accordance with the above-described correspondence such that the spacing between the real image and the mirror image of the heat shield 17 corresponds to the spacing at the initial position.

For example, where the bottom end of the heat shield 17 and the melt surface 13a are at the same level, spacing between the bottom end and a mirror image of the bottom end is zero. In this time, the spacing between the real image of the opening of the heat shield 17 and the mirror image of the opening is substantially zero. Therefore, this position (a level of the bottom end of the heat shield) may be used as a reference position for describing position of melt surface 13a and the spacing between the real image and the mirror image of the heat shield 17.

FIG. 2 illustrates center point (center point of opening) Sa of the real image Ma of the heat shield 17, and center points Sb, Sc of two mirror images Mb, Mc taken at two positions while lowering the quartz crucible 11.

In this process, positions of the melt surfaces 13a represented by the positions of the quartz crucible 11 vertically moved by the crucible support device (lift) 21 are recorded when the mirror images Mb and Mc are taken for determining the center points Sb and Sc. The spacing between two center points selected from Sa, Sb, and Sc are calculated based on pixel numbers or the like in the image data taken by the imaging device 18.

A center point of the real image of the heat shield 17 is determined as a center point of a circle obtained by circular approximation of edge of the real image of the heat shield 17. A center point of the mirror image of the heat shield 17 reflected on the melt surface 13a is determined as a center point of a circle obtained by circular approximation of edge (contour) of the mirror image. Thus, the spacing between the real image and the mirror image may be specified based on the spacing between the center points of the real image and the mirror image.

In the detection of contour (hereafter referred to as edge) of the heat shield 17 (e.g., contour of the opening of the heat shield 17), the brightness of the image is binarized by setting a threshold value. For example, a differentiated image may be used in the detection of the edge.

In the differentiated image, variation (delta) of the brightness of the original image is shown as data. Data of the differentiated image have relative-maximum values in the edges of the real image and the mirror image of the heat shield 17 regardless of brightness of the original image. Therefore, even when the temperature in the chamber is changed, it is possible to specify accurate position of the opening 17a of the heat shield with reduced measurement error by detecting the edges based on the relative-maximum value in the differentiated image.

Figure 3:
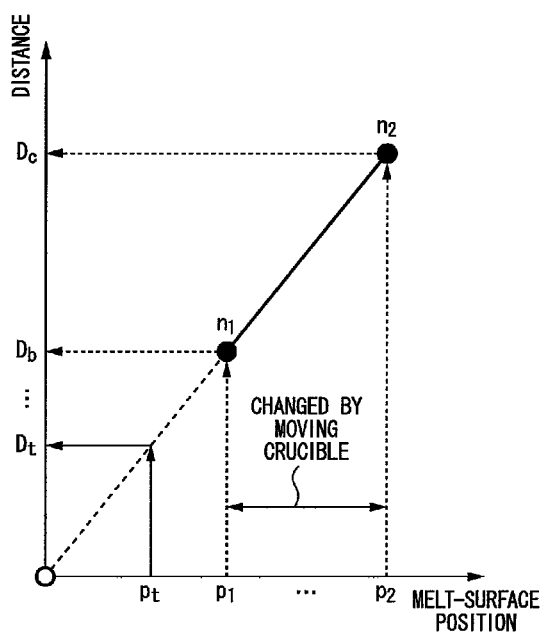
FIG. 3 is a graph showing an example of relationship between the position of a melt-surface and the spacing between the real image and mirror image.

FIG. 3 exemplifies a correspondence between the position of the melt surface 13a and the spacing between the real image Ma and the mirror image Mb, Mc of the heat shield 17. FIG. 3 is prepared based on a graph in which the spacing between the center Sa point of the real image Ma of the heat shield 17 and the center points Sb, Sc of mirror image at different positions of melt surface are plotted on the vertical axis, and different positions of the melt surface are plotted on the horizontal axis. The followings are the explanation for preparation of FIG. 3.

The movement of the position of the melt surface 13a is correctly controlled by movement of the crucible. In this time, vertical distance between a first position p1 and a second position p2 is recorded. For example, as shown in FIG. 2, a center point Sa of the real image Ma of the heat shield 17, a center point Sb of the mirror image Mb at the first position, and a center point Sc of the mirror image Mc at the second position are determined. The point Sb and the point Sc are plotted on the vertical axis such that the distance Db of the point Sb from the zero point corresponds to the spacing between the point Sa and the point Sb (that is, the distance between the heat shield and its mirror image), and the distance Dc of the point Sc from the zero point corresponds to the spacing between the point Sa and the point Sc. The first position p1 (e.g., the first position of the melt surface) is plotted on the arbitrary point of the horizontal axis, and the second position p2 is plotted on the horizontal axis such that an interval between the two plots corresponds to the vertical distance between the first position p1 and the second position p2. Then, a first nodal point n1 of the normal line drawn from point Db on the vertical axis and the normal line drawn from the point p1 on the horizontal axis, and second nodal point n2 of the normal line drawn from the point Dc on the vertical axis and the normal line drawn from the point p2 on the horizontal axis are determined on the graph. Next, horizontal coordinate is translated such that the zero point, the first nodal point n1, and the second nodal point n2 are on the same straight line. Thus, the graph exemplified by FIG. 3 is prepared.

By determining the inclination of the straight line connecting the points n1 and n2, correspondence between the position of the melt surface 13a controlled by the movement of crucible and the spacing between the real image Ma and mirror images Mb, Mc of the heat shield 17 is specified.

Where the correspondence (relationship) as shown in FIG. 3 is specified, a position (target position) of the melt surface 13a can be specified accurately. For example, where a target spacing (shown by target distance Dt in FIG. 3) between the real image and the mirror image corresponding to a target position pt of the melt surface 13a in the initial stage is predetermined, it is possible to set the position of the melt surface 13a at the target position pt by vertical movement of the quartz crucible 11 based on the target spacing and the above-specified correspondence. Thus, it is possible to control the position of the melt surface 13a with a high level of accuracy.

In the following, a practical embodiment of calculating (setting) the surface position of the silicon melt by the first operation unit 24 is explained.

In the first operation unit 24, the real image and the mirror image of the heat shield 17 are detected from the image taken by the imaging device 18. Then, in the first operation unit 24, the center position of the real image and the mirror image are calculated, and the absolute value of an initial gap Δt (spacing between the bottom end of the heat shield and the melt surface 13a as shown in FIG. 1) is determined based on the spacing between the center points.

Figure 4:
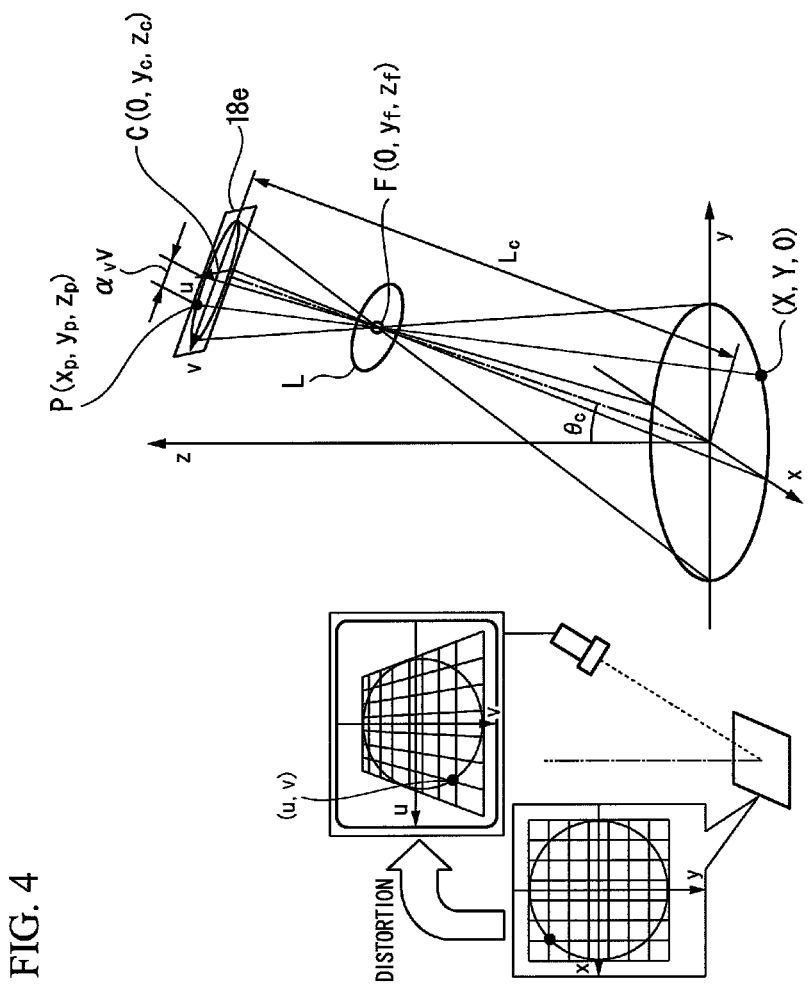
FIG. 4 is a drawing for explaining setting of the position of a melt-surface by the first operation unit.

As shown in left side of FIG. 4, horizontal dimension is distorted in the image taken by the imaging device 18 due to inclination of the optical axis of the imaging device 18 about the vertical axis. Therefore, in the image taken by the imaging device 18, the real image and the mirror image of the heat shield 17 are relatively magnified in the lower side of the image compared to the upper side of the image, since the area shown in the lower side of the image is relatively close to the imaging device compared to the area shown in the upper side of the image.

The above-described distortion of the image is corrected by projecting the point on the element of the imaging device 18 to a reference plane (base plane). Here, the reference plane is set at the level of the bottom end of the heat shield 17.

Right side of FIG. 4 schematically shows a coordinate system in the time of correcting the image. In this coordinate system, the reference position of the melt surface (hereafter, referred to as reference plane) is shown as the x-y plane. The origin point of the coordinate is set at a nodal point between the reference plane and the straight line (chain line in FIG. 4) that connects the center C of the imaging element 18e and the center F of the camera lens L.

The pulling direction of a silicon single crystal ingot is positive in the z-direction. The center C of the imaging element and the center F of a camera lens are set in the y-z plane. The coordinate (u,v) in the image in the left part of FIG. 4 is expressed by pixel value of the imaging element 18e, and corresponds to a point P ($x_p$, $y_p$, $z_p$) on the imaging element 18e. The x, y, z-coordinates of point P are expressed by the following formula 1.

$$\left. \begin{array}{l} x_p = -a_u u \\ y_p = y_c - a_v v \cos\theta_c \\ z_p = z_c + a_v v \sin\theta_c \end{array} \right\} \quad (1)$$

Here, $a_u$ and $a_v$ denote sizes of imaging pixel along lateral and longitudinal directions of the imaging element 18e respectively, and $y_c$ and $z_c$ denote y-coordinate and z-coordinate of center C of the imaging element 18e. As shown in FIG. 4, θc is an inclination angle of the chain line (optical axis) about the z-axis. The coordinate (0, $y_c$, $z_c$) of the center C is expressed by the following formula 2 using the coordinate (0, $y_f$, $z_f$) of the center F of the camera lens L.

$$\left. \begin{array}{l} y_c = \sqrt{y_f^2 + z_f^2} \left[ 1 + f_l / (\sqrt{y_f^2 + z_f^2} - f_l) \sin\theta_c \right] \\ z_c = \sqrt{y_f^2 + z_f^2} \left[ 1 + f_l / (\sqrt{y_f^2 + z_f^2} - f_l) \right] \cos\theta_c \end{array} \right\} \quad (2)$$

Here, $f_1$ denotes a focal length of the camera lens. By regarding the lens L as a pin hole, point P ($x_p$, $y_p$, $z_p$) on the imaging element is projected via F (0, $y_f$, $z_f$) to the reference plane.

Where the thus projected point is expressed as (X, Y, 0), the x-coordinate and y-coordinate of the point (X, Y, 0) can be expressed by the following formula 3.

$$X = -x_p z_f / (z_p - z_f)$$
$$Y = (y_f z_p - y_p z_f) / (z_p - z_f)$$  (3)

By using the above-described formulae 1 to formula 3, the real image and the mirror image of the circular opening 17a of the heat shield can be projected to the reference plane, and center positions of the real image and the mirror image can be determined. The center positions of the real image and the mirror image may be calculated based on the coordinates of the real image and the mirror image using least square method. The following is an example of calculation of the center positions.

In this embodiment, opening 17a of the heat shield 17 has a circular shape. An image of the opening satisfies the following formula 4 that describes a circular shape.

$$(x-x_0)^2 + (y-y_0)^2 = r^2$$  (4)

Here, $(x_0, y_0)$ and r in the formula 4 are unknown factors (coordinate of center of a circle and radius of the circle) which should be determined using the least square method.

To perform the least square calculation simply, the formula 4 is modified as shown in the following formula 5.

$$z = a + bx + cy$$  (5)

$$z = x^2 + y^2$$
$$a = r^2 - x_0^2 - y_0^2$$
$$b = 2x_0$$
$$c = 2y_0$$

The $x_0$, $y_0$, and r can be determined by calculating variables a, b, and c in the formula 5 by least square method. The method determines conditions for minimize the sum of square of difference between the value in accordance with the formula 5 and the value of measured point. The conditions can be obtained by solving the partial differential equation shown in the below described formula 6.

$$\frac{\partial}{\partial a, b, c} \sum_i (a + bx_i + cy_i - z_i)^2 = 0$$  (6)

Solution of the formula 6 can be calculated based on the simultaneous equations shown in the below described formula 7.

$$\begin{pmatrix} \sum_i z_i \\ \sum_i z_i x_i \\ \sum_i z_i y_i \end{pmatrix} = \begin{pmatrix} n & \sum_i x_i & \sum_i y_i \\ \sum_i x_i & \sum_i x_i^2 & \sum_i x_i y_i \\ \sum_i y_i & \sum_i x_i y_i & \sum_i x_i^2 \end{pmatrix} \begin{pmatrix} a \\ b \\ c \end{pmatrix}$$  (7)

Figure 5:
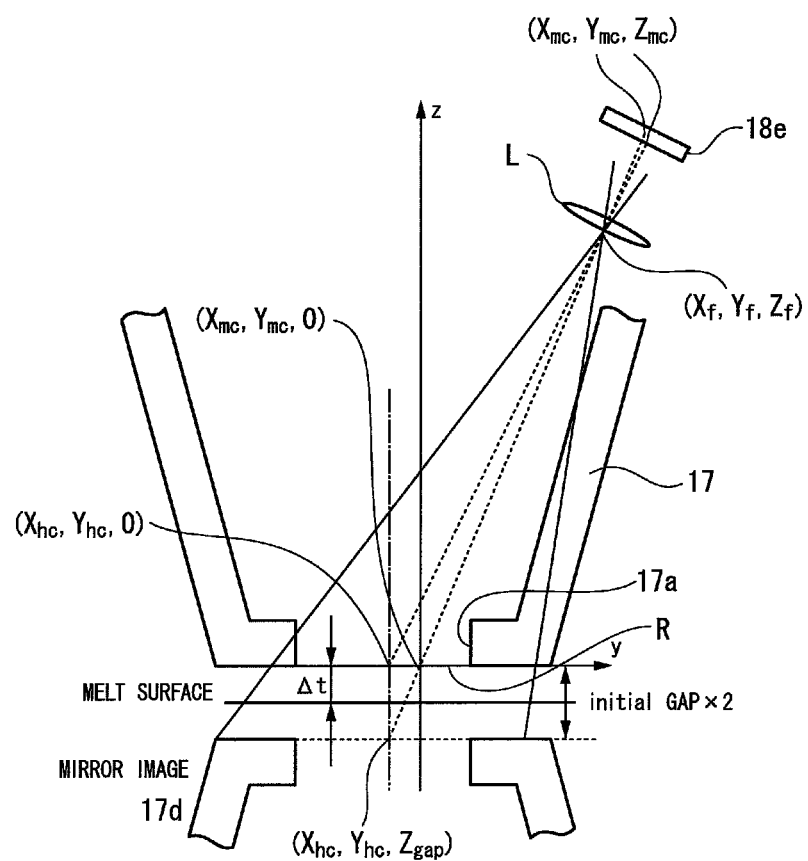
FIG. 5 is a drawing for explaining setting of the position of a melt-surface by the first operation unit.

Thus, coordinates of the positions $(Xh_c, Yh_c, 0)$, $(Xm_c, Ym_c, 0)$ of the real image and the mirror image of the heat shield 17 projected to the reference plane R shown in FIG. 5 are calculated based on the projected images by using the least square method. FIG. 5 schematically shows a concept for calculating absolute value of the gap $\Delta t$ based on the thus calculated coordinates of the center positions.

Mirror image of the heat shield 17 is obtained as an image of a dummy heat shield 17d that is plane symmetric to the real heat shield 17 about the melt surface. Where the heat shield 17 is disposed horizontally, center coordinate of the mirror image (dummy heat shield 17d) is disposed at the position that is plane symmetric to the center coordinate $(X_{hc}, Y_{hc}, 0)$ of the real image of the heat shield 17 about the melt surface, where a line connecting the two center coordinates is parallel to the z-axis. Therefore, a spacing between the two positions is twice the gap $\Delta t$ to be calculated.

The center of the mirror image (dummy heat shield 17d) positioned at the coordinate $(X_{hc}, Y_{hc}, Z_{gap})$, center of the lens $(X_f, Y_f, Z_f)$, and the center of the mirror image obtained by the imaging element are on the same straight line. Therefore, coordinate $(X_{mc}, Y_{mc}, 0)$ of center of the mirror image of the heat shield 17 projected on the reference plane through the center of the lens is on the same line connecting the coordinates $(X_{hc}, Y_{hc}, Z_{gap})$ and $(X_f, Y_f, Z_f)$. Here, absolute value of Zgap denotes the spacing between the center of the real image and the center of the mirror image.

Based on the above-described relationship, the gap $\Delta t$ (Gap) can be expressed by the following formula 8.

$$-2\text{Gap} = Z_{gap}$$  (8)
$$= z_f - z_f (Y_{mc} - y_f) / (Y_{hc} - y_f)$$

So as to determine the absolute value of the gap in the present embodiment, it is required to detect the real image and the mirror image of the heat shield steadily. Binarization of brightness using a threshold value is generally used as a method for detecting a certain shape from an image data. However, where the contour of the heat shield in the apparatus of pulling a single crystal is detected based on the general binarization method, position of the contour of the heat shield deviates due to change of brightness caused by change of temperature in the chamber. Therefore, in the present embodiment, the image (contour) of the heat shield was detected not by the general binarizing method but based on the change (differential) of brightness.

By this method, it is possible to detect the real image and the mirror image of the heat shield stably while avoiding influence of the change of brightness caused by change of temperature in the chamber. In the process of detection, change of brightness is determined by differentiating the distribution of brightness in the lateral direction. The differential of brightness is calculated based on difference of brightness. In this case, the brightness is largely influenced by noise in the image.

Therefore, in the present embodiment, the average value is determined based on the data of differential of brightness of nine pixels, thereby eliminating the influence of noise. Positions (positions of the contours) of the real image and the mirror image of the heat shield are determined by detecting the peak positions of the thus calculated data of differential of brightness.

Figure 6:
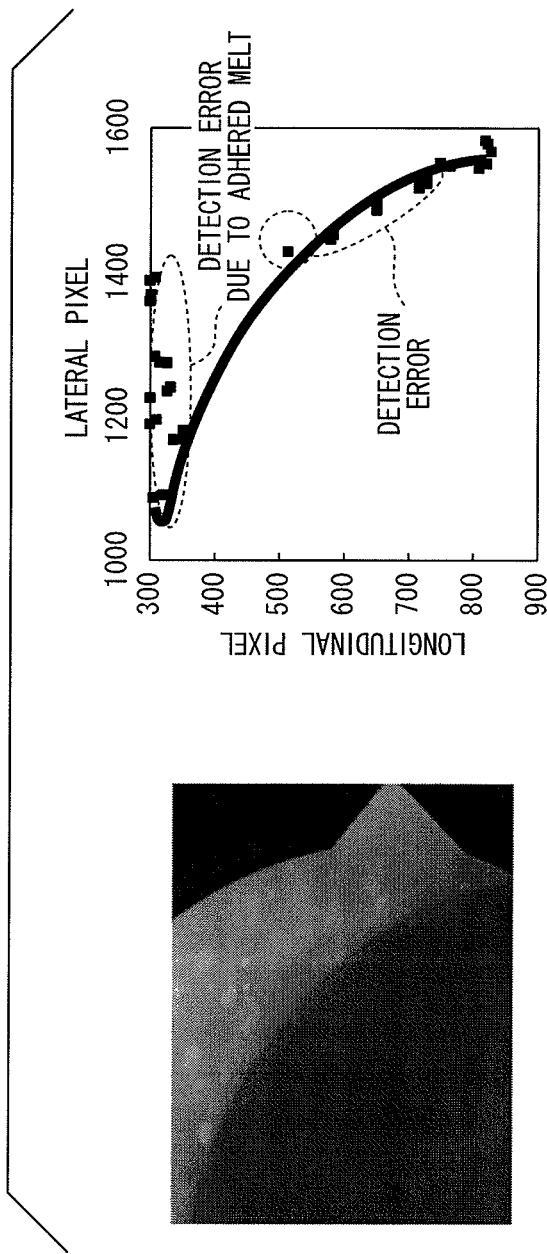
FIG. 6 is a drawing for explaining setting of the position of a melt-surface by the first operation unit.

FIG. 6 shows a result of detection of the edge (contour) of the heat shield based on the above-explained method. The left image shows an image used in the detection. As shown in the image, the silicon melt occasionally splashes and adheres to partial portions of the bottom surface of the heat shield. In such a case, data of the edge of the heat shield obtained as a result of detection include numerous detection errors as shown in the right graph in FIG. 6. Where the resultant data of the edge including the detection errors are used to calculate the value of the gap, the value includes large error. Therefore, it is necessary to introduce a process to recognize and remove the detection error due to the adhered melt.

Figure 7:
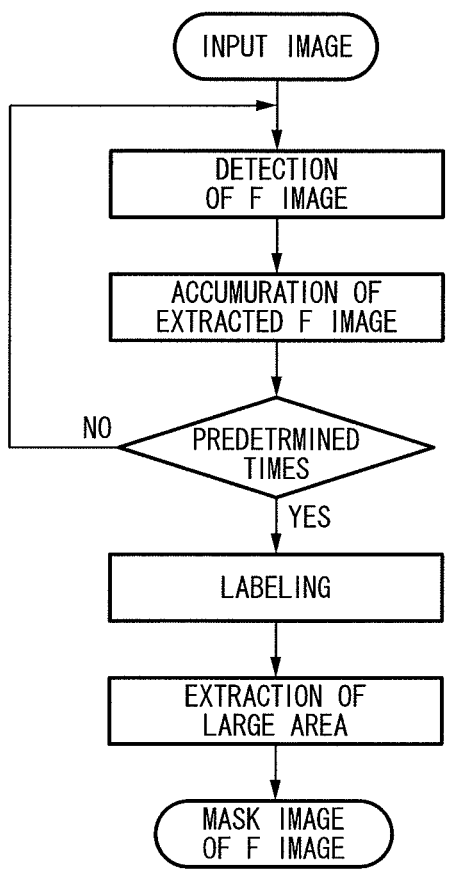
FIG. 7 is a flowchart that shows setting of the position of a melt-surface by the first operation unit.

Therefore, in the present embodiment, edges of the real image and the mirror image of the heat shield are extracted from the raw data of detected edges of the heat shield using an image processing algorithm. The real image and mirror image have a relatively large area compared to the other part, for example, image of the adhered melt. Therefore, in the image processing, the real image and the mirror image are extracted utilizing the difference in the area. FIG. 7 shows a flow chart of image processing algorithm. F image in FIG. 7 denotes an image of the heat shield.

In this image processing it is necessary to distinguish edge groups neighbor to each other and to perform labeling to attach the same label (number) to the component of the same linkage.

Figure 8:
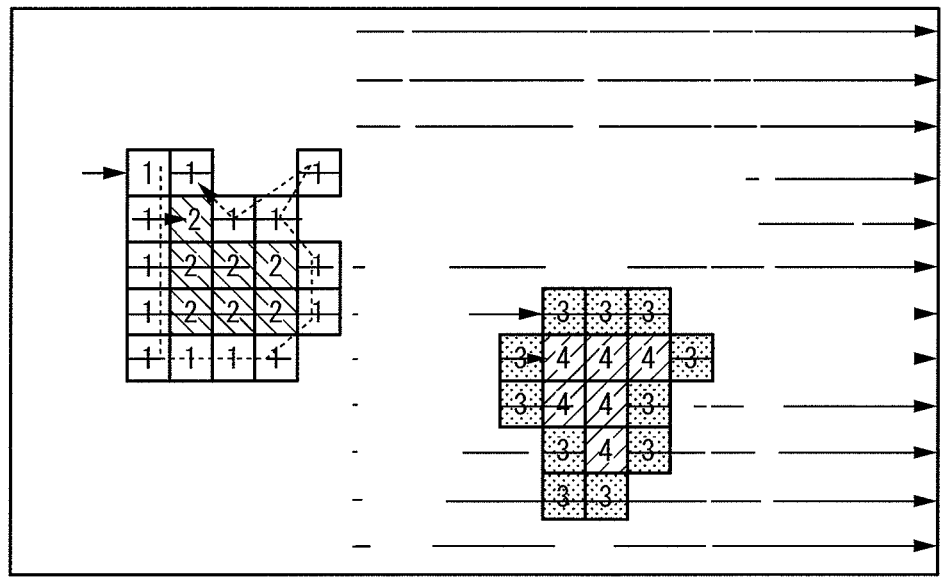
FIG. 8 is a drawing for explaining setting of the position of a melt-surface by the first operation unit.

FIG. 8 shows a concept of general labeling algorithm, where 1, 2, 3, 4 denote labels attached to pixels. In this algorithm, scanning of the image starts from the upper left to search pixel showing a brightness value of 255. Where a pixel of 255 is detected, other pixels of 255 are searched from the surroundings of the first detected pixel. Where a second 255 pixel is detected, searching of 255 pixel is repeated in the surroundings of the second 255 pixel. Therefore, in such an embodiment, labeling is performed in connection with scanning from the upper left of the image.

In the thus explained general labeling algorithm, since the surroundings of the pixel of 255 value is scanned, numbers of scanning increases depending on the characteristics of the image resulting in a long processing time. Further, in general, different labels are occasionally attached to the component of the same linkage depending on the shape of the component of the linkage. Therefore, in the general method, the image is totally scanned after the labeling, and the labels are re-attached.

For example, 2 second is required for processing of the image composed of two million pixels. On the other hand, it is desirable to control the processing time including the calculation of the initial gap within about 100 milli-seconds. Therefore, high speed labeling algorithm is required.

Figure 9:
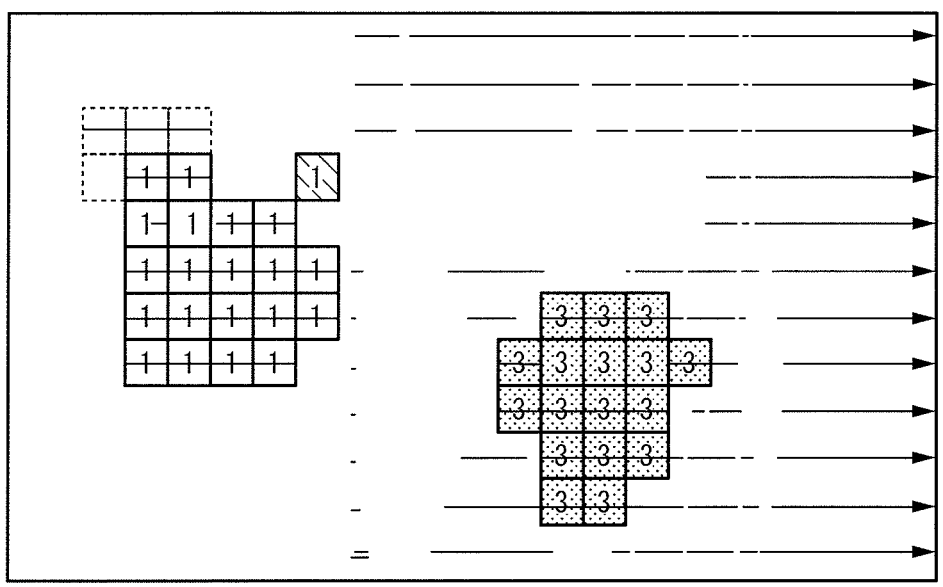
FIG. 9 is a drawing for explaining setting of the position of a melt-surface by the first operation unit.

FIG. 9 shows a concept of modified labeling algorithm, where 1 and 3 denote labels attached to pixels. In this algorithm, the number of times to scan an image can be controlled to be 1 time. As the general labeling algorithm, scanning starts from the upper left of the image to search for pixel 255. When the first 255 pixel (pixel showing the brightness value of 255) is detected, the pixels on the left, the upper left, the upper side, and the upper right of the first pixel is checked. Where a label is attached to one of these pixels, the same label is attached to the first pixel. Then, the scanning restarts from the first pixel.

In the thus modified labeling algorism, re-labeling is omitted by the modification of processing, and only one scanning time is required for one image. Therefore, the processing time is largely reduced compared to the conventional labeling method.

In addition, area of the each linkage component is calculated by counting the number of labeled pixels in the above-described sequence of processing. As a result, it is possible to reduce the time for extracting the image (edge) of the heat shield in the next step. It was confirmed that the processing time in the labeling could be shortened to 30 milli-seconds by the above-described sequence.

Figure 10A:
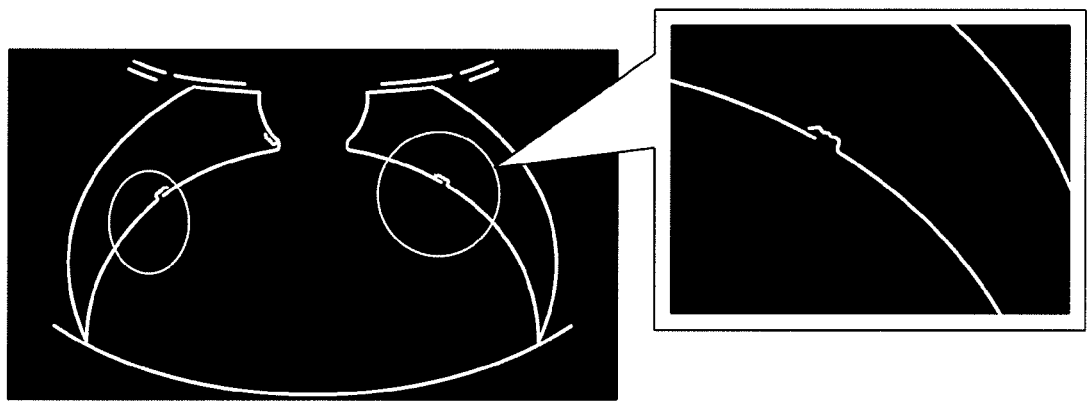
FIG. 10A is a drawing that shows an example of detection of an edge of the heat shield.
Figure 10B:
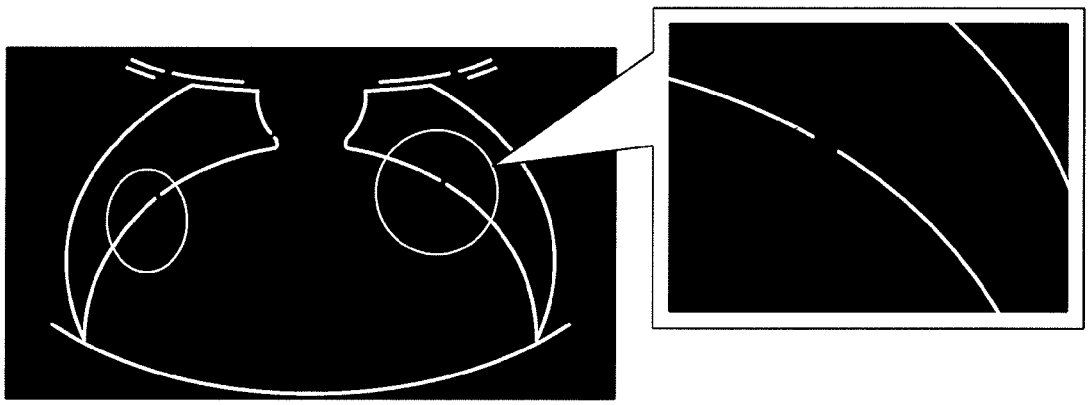
FIG. 10B is a drawing that shows an example of detection of an edge of the heat shield.

FIG. 10 shows a result of image processing using the labeling algorithm. FIG. 10A shows a result of detection of real image and mirror image of the heat shield without removing the adhered melt. Detection errors are observed in the part shown by the circles. On the other hand, FIG. 10B shows a result where the adhered melt is removed. The detection errors are removed from the part shown by the circles.

Next, constitution and function of the second operation unit 25 are explained.

Figure 11:
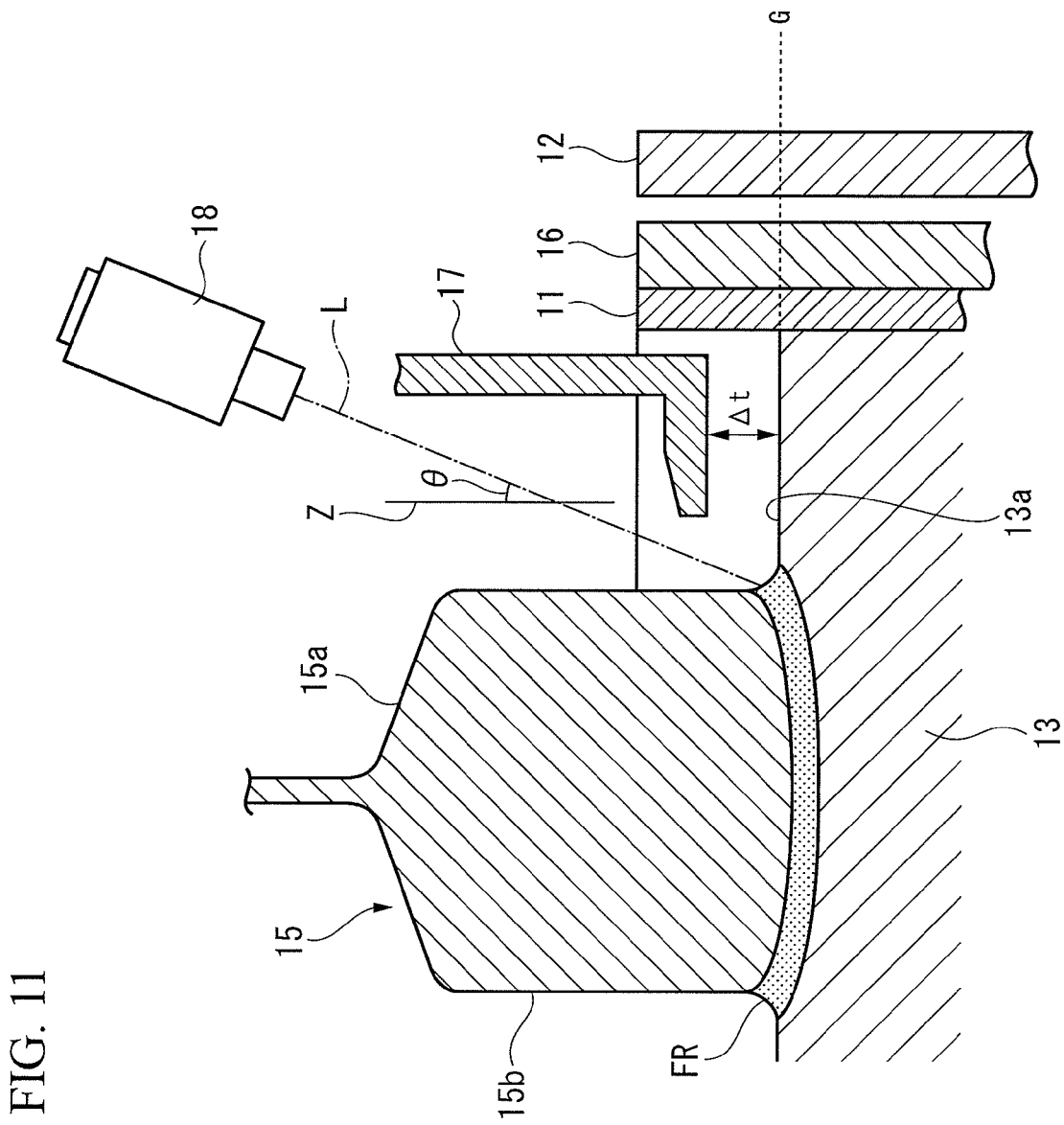
FIG. 11 is a drawing for explaining setting of the position of the melt-surface by the second operation unit.

FIG. 11 shows a schematic drawing that shows setting of melt surface by the second operation unit.

During the pulling process of a silicon single crystal 15, a bright zone FR (fusion ring) appears in the vicinity of the solid-liquid interface between the silicon melt 13 and the silicon single crystal 15. The second operation unit 25 takes an image of the bright zone FR using the imaging device 18, for example, constituted of a CCD camera.

The thus obtained image data of the bright zone FR is subjected to circular approximation or elliptic approximation, thereby determining the center position of the silicon single crystal 15.

Figure 12:
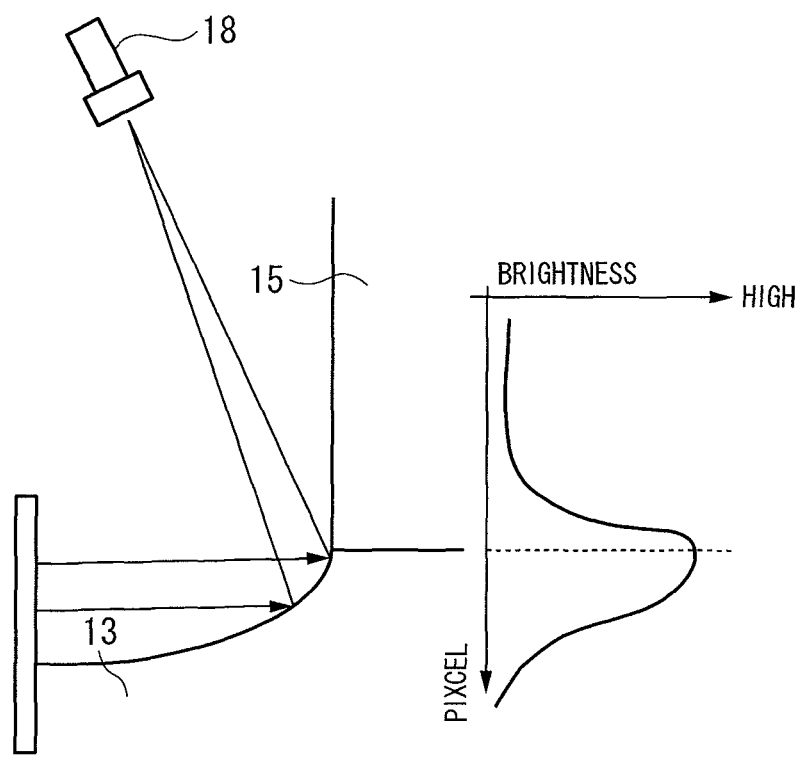
FIG. 12 is a drawing for explaining setting of the position of the melt-surface by the second operation unit.

Brightness of the bright zone (fusion ring) FR imaged by the imaging device 18 shows a distribution, for example, as shown in the right graph of FIG. 12. That is, the peak of the brightness of the bright zone FR correspond to the melt-surface directly beneath the silicon single crystal 15 (that is, solid-liquid interface), and the slope of the brightness corresponds to the inclined surface of the silicon melt 13.

Therefore, center of approximated circle that has been determined from the peak brightness of the bright zone FR corresponds to the center position of the solid-liquid interface of the silicon single crystal 15. On the other hand, where the calculation is performed using the data from the slope of the brightness of the bright zone FR, the position of the melt surface below the solid-liquid interface is determined.

Figure 13:
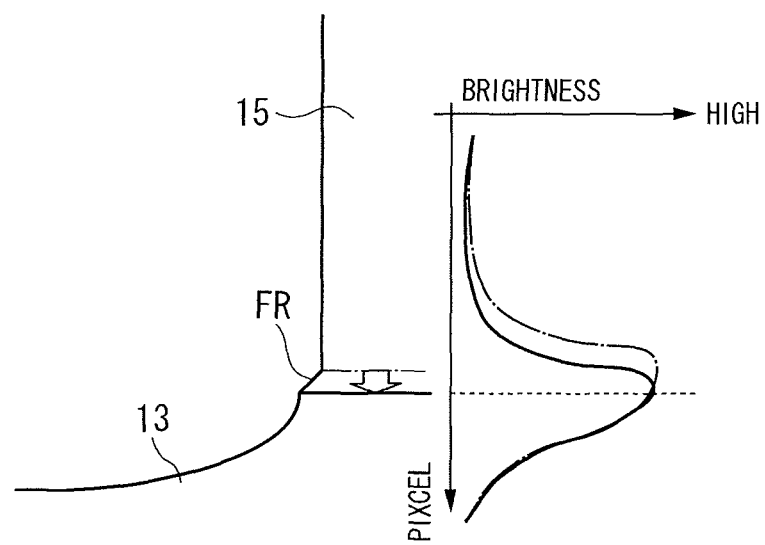
FIG. 13 is a drawing for explaining setting of the position of the melt-surface by the second operation unit.

Position of the solid-liquid interface of the silicon single crystal 15a changes when a diameter of the body portion 15a of the crystal changes during pulling the crystal. For example, when the diameter of the silicon single crystal 15 starts to decrease during the pulling, position of the solid-liquid interface is lowered in accordance with the decrease of the diameter. At this time, the position of the peak of brightness of the bright zone FR changes as shown in FIG. 13.

Position of the solid-liquid interface before the change of diameter of the silicon single crystal 15 is reflected in the position of the peak brightness of the bright zone FR. As a result, the position of the center of the approximated circle or the approximated ellipse reflects a change of the height of the solid-liquid interface in the time of change of the diameter of the silicon single crystal 15.

In the determination of the center position, it is preferable to calibrate (correct) the image data of the bright zone FR based on an angle θ formed by the direction L of the optical axis of the imaging device 18 and the pulling direction Z of the single crystal. After the simple calibration, image data of the bright zone FR may be subjected to circular approximation or elliptic approximation, thereby calculating the position of the center of the silicon single crystal 15. For example, the above-described calibration may be performed by the following formula 9.

$$x' = (x - x_0)$$

$$y' = (y - y_0)/((h/v)\cos\theta) \quad (9)$$

In the above-described formula 9, x denotes detected position in the lateral direction in the image, $x_0$ denotes ½ of pixel numbers in the lateral direction of the imaging element, x' denotes a lateral position after the calibration, and y denotes a detected position in the longitudinal direction, $y_0$ denotes ½ of pixel numbers in the longitudinal direction of the imaging element, y' denotes a longitudinal position after the calibration.

A two-dimensional CCD camera may be used as the imaging device 18 used in the imaging of the bright zone FR. Alternatively, scan imaging of the bright zone FR may be performed by mechanically moving a one-dimensional CCD camera in the horizontal direction, or by changing the imaging direction of the one-dimensional CCD camera. The imaging device 18 may be a plurality of, that is, two or more, CCD cameras.

Preferably a meniscus portion of the bright zone FR includes a solid-liquid interface of the silicon single crystal 15. It is known that the height of the solid-liquid interface changes in accordance with a change of a diameter of the silicon single crystal 15. Influence of the change of the height is small in a region of the bright zone FR having a meniscus angle of 30 to 50 degrees. Therefore it is preferable to use the region to calculate the position of the solid-liquid interface.

The position of the melt surface of the silicon melt 13 in the quartz crucible 11 is calculated based on the data of the thus obtained center of the silicon single crystal 15. For example, in the calculation of the position of the melt surface, a calibration curve showing a correspondence between the center position of the silicon single crystal 15 and the position of the melt surface of the silicon melt may be prepared preliminarily. Then, the value of the center position of the silicon single crystal obtained in the determination of the center position is applied to the calibration curve, thereby converting the value to the surface position of the silicon melt. Thus, it is possible to calculate a (current) surface position of the silicon melt 13.

A gap Δt between the thus obtained surface position (melt surface 13a) of the silicon melt 13 and the heat shield 17 is calculated in the controlling unit 26. The controlling unit 26 controls the thermal gradient (Gc) of the crystal temperature in the vicinity of the solid-liquid interface in the center portion of the silicon single crystal 15 and the thermal gradient (Ge) of the crystal temperature in the vicinity of the solid-liquid interface in the peripheral portion of the silicon single crystal 15 respectively based on the gap Δt.

In the controlling step, the controlling unit 26 controls the amount of movement of the crucible supporting unit (lift) 21 based on the gap Δt between the surface position (melt surface 13a) of the silicon melt 13 and the heat shield 17. For example, a relative change of the surface position of the silicon melt after advancing pulling is detected with reference to the surface position of the silicon melt in the time of starting pulling of the body region (body portion) 15b of the silicon single crystal 15.

Then, based on the relative change of the melt-surface position, the quartz crucible 11 is lifted up using the crucible supporting unit (lift) 21.

By this treatment, a melt surface 13a of the silicon melt 13 is maintained at the same position G relative to the heater 12 even when the amount of silicon melt decreases in accordance with advancing the pulling of the silicon single crystal 15. As a result, it is possible to maintain distribution of the heat radiation to the silicon melt 13 constantly. Then, the thermal gradient (Gc) of the crystal temperature in the vicinity of the solid-liquid interface in the center portion of the silicon single crystal 15 and the thermal gradient (Ge) of the crystal temperature in the vicinity of the solid-liquid interface in the peripheral portion of the silicon single crystal 15 are controlled optimally.

Pulling process of silicon single crystal using an apparatus of pulling a silicon single crystal (apparatus of producing a silicon single crystal) 10 equipped with the above-explained first operation unit and the second operation unit is explained in the following.

Firstly, polysilicon is charged in the quartz crucible 11. The quartz crucible 11 is heated by a side heater that is disposed so as to surround the crucible 11 as shown in FIG. 1. Then, the polysilicon is molten, and silicon melt 13 is formed in the quartz crucible 11.

In this time, position of the melt surface 13a is unknown. In this stage, that is, in the initial stage (beginning stage) of pulling, position of the melt surface is set using the first operation unit 24 based on the spacing between the real image Ma of the heat shield 17 and the mirror image Mb of the heat shield 17 reflected on the surface of the silicon melt.

Image of the melt surface 13a and heat shield 17 is taken by the imaging device 18. As shown in FIG. 2, real image Ma of the heat shield 17 and mirror images Mb, Mc of the heat shield 17 reflected on the surface of the melt surface 13a are taken by the imaging device 18 by changing the position of the melt surface 13a by moving the crucible 11 up and down.

Then, spacing between the centers (spacing between the center points Sa, Sb, and Sc) of the real image Ma and the mirror images Mb, Mc is measured for a plural positions of the melt surface 13a (2 points in FIG. 3) based on the image data of the imaging device 18. Thus, relationship between the spacing of the center position and the position of the melt surface is specified, where a reference position is set for a position where the spacing between the center points is zero.

Based on the corresponding relationship, a position of the melt surface 13a corresponding to the target spacing of the center positions is specified. The quartz crucible 11 is vertically moved such that the distance between the set position and practical position of the melt surfaced 13a in the quartz crucible 11 is zero. By this procedure, it is possible to set an initial position of the melt-surface 13a in the time of dipping the seed crystal 14 in the silicon melt 13 correctly.

After dipping the seed crystal 14 in the silicon melt 13 having a melt surface 13a correctly set at the initial surface position, the seed crystal is pulled while rotating the seed crystal at a predetermined rate such that a shoulder portion 15a having gradually increasing diameter is formed beneath the seed crystal. After that setting of the melt-surface position is performed by the second operation unit 25. That is, an operation unit for setting of the surface position of the silicon melt 13 is switched from the first operation unit 24 to the second operation unit 25.

For example, in the pulling of the straight body portion (body region) 15b having a predetermined diameter, position of the melt-surface 13a is set by the second operation unit 25. In this process, an image of bright zone (fusion ring) FR appearing in the vicinity of the solid-liquid interface between the silicon melt 13 and the silicon single crystal 15 is taken by the imaging device 18. The image data of the bright zone are subjected to circular approximation or elliptic approximation, thereby determining the center position of the silicon single crystal 15.

Position of the melt-surface in the crucible 11 is calculated based on the thus obtained data of the center position of the silicon single crystal 15, and a spacing (gap) Δt between the position of melt surface 13a of the silicon melt 13 and the heat shield 17 is calculated. Then, thermal gradient (Gc) of the crystal temperature in the vicinity of the solid-liquid interface in the center portion of the silicon single crystal 15 and the thermal gradient (Ge) of the crystal temperature in the vicinity of the solid-liquid interface in the peripheral portion of the silicon single crystal 15 are respectively controlled based on the gap Δt.

By this treatment, melt surface 13a of the silicon melt 13 is maintained at the same position G relative to the heater 12 even when the amount of silicon melt decreases in accordance with advancing pulling of the silicon single crystal 15. As a result, it is possible to maintain distribution of the heat radiation to the silicon melt 13 constantly. Then, the thermal gradient (Gc) of the crystal temperature in the vicinity of the solid-liquid interface in the center portion of the silicon single crystal and the thermal gradient (Ge) of the crystal temperature in the vicinity of the solid-liquid interface in the peripheral portion of the silicon single crystal are controlled optimally.

As explained above, by setting the surface position of the silicon melt 13 by the first operation unit 24 in the initial stage of crystal pulling based on the spacing between the real image and the mirror image of the heat shield 17, by switching the operation unit from the first operation unit 24 to the second operation unit 25 at the time when the pulling of body portion starts, and by setting the surface position of the silicon melt 13 based on the image of the bright zone (fusion ring) FR, it is possible to control the position of the surface 13a of the silicon melt 13 accurately such that V/G is controlled to be in a range required to obtain designated defect-free region from the dipping of the seed crystal in the silicon melt to the end of pulling the whole length of the crystal. Therefore, it is possible to obtain high quality silicon single crystals having the defect-free region stably at high yield. The switching of operation unit for setting the surface of the silicon melt from the first operation unit 24 to the second operation unit 25 may be performed at any time during forming the shoulder portion 15a.

It is possible to determine the absolute value of the height of the melt surface 13 by the first operation unit 24. When the diameter of the silicon single crystal increases to a value such that a real image Ma of the heat shield 17 and mirror image Mc of the heat shield 17 obtained by the imaging device 18 do not have a sufficient area to determine the position of the melt surface, the position of the melt surface is set by the second operation unit 25. During the growth of the shoulder portion 15a, setting of the surface position may be performed in parallel by the first operation unit 24 and the second operation unit 25 or by alternately switching the operation unit between the first operation unit 24 and the second operation unit 25 a plurality of times. By this process, it is possible to determine the absolute height of the surface of the silicon melt 13 when the melt surface is set by the second operation unit 25. That is, by utilizing the absolute value of the melt surface level obtained by the first operation unit 24, the relative surface level of the silicon melt obtained by the second operation unit 25 in the subsequent pulling of the body portion can be converted to absolute value. Therefore, the surface level of the silicon melt is also controlled as an absolute value using the second operation unit 25. As a result, it is possible to control the crystal properties depending on the surface level of the silicon melt as well as the other crystal growth controlling properties can be controlled in the pulling of the body portion, thereby producing crystals of designated properties. Such a control has been impossible in the conventional method since it has been impossible to determine the surface level as the absolute value, resulting in failure of accurate control.

EXAMPLE

Setting of the position of the melt surface using the first operation unit of the apparatus of producing a silicon single crystal according to an embodiment of the present invention was examined. That is, the effectiveness of measurement of initial gap in the time of starting the pulling was verified. In the examination, the initial gap was changed by moving the crucible after forming the silicon melt. The changed value was compared to the measured value.

Figure 14:
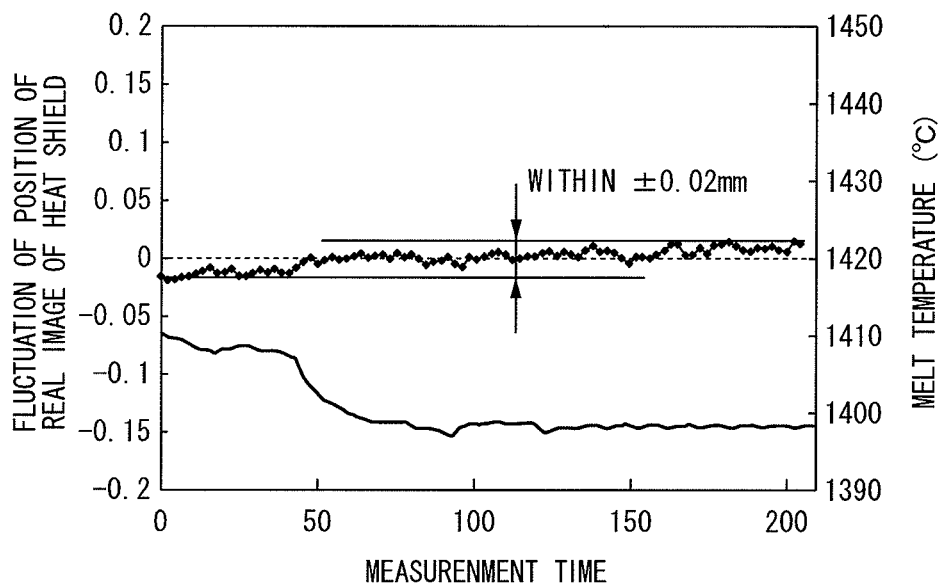
FIG. 14 is a graph showing an example of verification of an effect of the present invention.

FIG. 14 shows a result of measurement of the position of the real image of the heat shield at the time of testing. A change of temperature in the chamber changes brightness distribution and possibly affects detection of the edge of the real image of the heat shield. In this examination, the position shown by the real image does not change since the heat shield is fixed to the chamber. Therefore, the variation in the measured value of the position of the real image of the heat shield is an error that affects the accuracy of the measurement of the initial gap directly.

In the test shown in FIG. 14, the temperature in the chamber was changed remarkably by changing the heater temperature by not less than 10° C.

During this time, variation of the measured value of the position of the real image of the heat shield was within ±0.02 mm. Thus, it was confirmed that influence of temperature variation on the measurement of the initial gap was controlled to be a small level.

Figure 15:
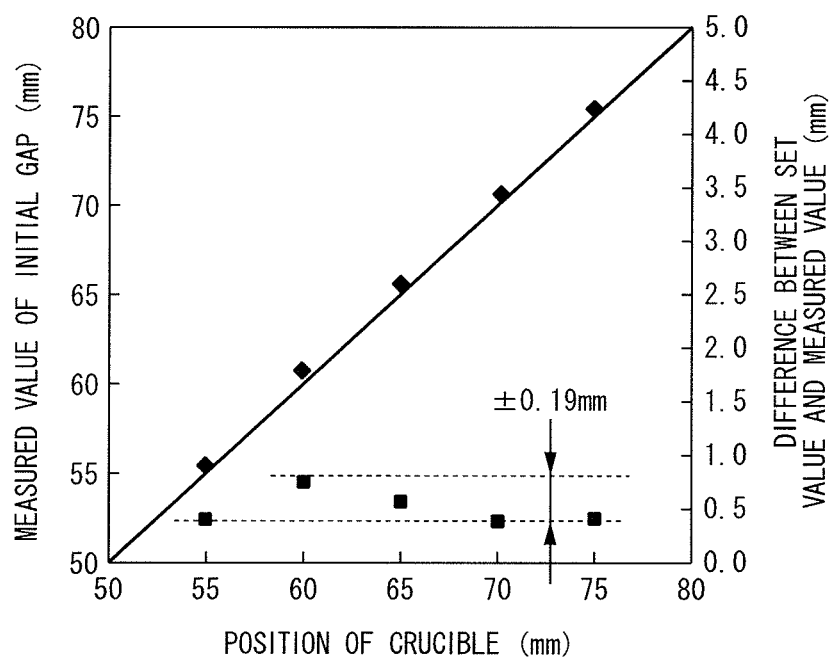
FIG. 15 is a graph showing an example of verification of an effect of the present invention.

FIG. 15 shows a comparison of initial gaps calculated by the examination and gap values changed by changing the position of the crucible. The initial setting was 65 mm which was set by manual operation by an operator. The points plotted along the inclined line on FIG. 15 show the comparison, and points plotted along the horizontal line show the differences between the two values at each level. Since the points on the horizontal line are plotted in the range between 0.4 to 0.8 mm, a measured value of initial gap shows a value about 0.5 mm larger than the manually determined value.

This difference is considered to show a deviation in the setting of the initial gap in the time of examination. On the other hand, where the results shown in FIG. 15 are examined as a variation in gaps, the difference between the measured initial gap and the set value of an initial gap is within the range of ±0.02 mm.

As a result, it was confirmed the gap could be measured accurately with a small variation of ±0.02 mm.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An apparatus of producing a silicon single crystal by pulling a silicon single crystal from a silicon melt formed in a crucible, comprising:
    an imaging device that takes an image of a region including a surface of the silicon melt from a direction that is inclined with a predetermined angle about a pulling axis of the silicon single crystal;
    a heat shield that is disposed so as to cover a partial surface of the silicon melt and that has a circular opening through which the silicon single crystal during pulling penetrates;
    a first operator that operates the imaging device and takes a real image of the heat shield including the opening and a mirror image of the heat shield reflected on the surface of the silicon melt, measures a spacing between the real image and the mirror image, and calculates a position of the surface of the silicon melt;

a second operator that operates the imaging device and takes an image of a bright-zone appearing in the vicinity of an interface between the silicon melt and the silicon single crystal, and calculates a position of the surface of the silicon melt based on a center position of the silicon single crystal that is determined based on the image of the bright zone; and a controller that refers a data of the position of the surface of the silicon melt obtained by the first operator and a data of the position of the surface of the silicon melt obtained by the second operator, and controls the position of the surface of the silicon melt in during the pulling of the silicon single crystal, wherein the first operator transforms contours of the real image and the mirror image of the heat shield obtained by the imaging device to project the contours of the real image and the mirror image to a plane corresponding to a lower end position of the heat shield, the first operator calculates a center position of the projected real image of the heat shield through circular approximation of the contour of the opening of the real image of the heat shield that appears as an elliptic shape, the first operator calculates a center position of the projected mirror image of the heat shield through circular approximation of the contour of the opening of the mirror image of the heat shield, and the first operator measures the spacing between the real image and the mirror image based on a spacing between the center positions of the projected real image and the projected mirror image of the heat shield.

2. The apparatus of producing a silicon single crystal according to claim 1, wherein the first operator determines the contours of the real image and the mirror image of the heat shield based on differential data of the real image and the mirror image taken by the imaging device.

3. The apparatus of producing a silicon single crystal according to claim 1,
wherein the first operator selects a contour from contours of each of the real image and the mirror image obtained by the imaging device such that the selected contour encloses an area of not smaller than a predetermined area and the first operator uses the selected contour in calculation of the center position of each of the real image and the mirror image of the heat shield.

4. The apparatus of producing a silicon single crystal according to claim 1, wherein the imaging device takes an image from an angle such that a deviation between the contour of each of the real image and the mirror image of the heat shield and a circular approximated image of the opening of the heat shield is minimized.

5. The apparatus of producing a silicon single crystal according to claim 1, wherein in an initial stage of pulling a silicon single crystal, the first operator performs setting of the position of the surface of the silicon melt based on the spacing between the real image and the mirror image of the heat shield;

from the end on the initial stage to a stage where a diameter of the silicon single crystal reaches a predetermined value, the first operator controls the position of the surface of the silicon melt through the controller based on the spacing between the real image and the mirror image of the heat shield; and in a stage after the diameter of the silicon single crystal reaches the predetermined value, the second operator controls the position of the surface of the silicon melt through the controller based on the center position of the silicon single crystal determined from the image of the bright zone.

6. The apparatus of producing a silicon single crystal according to claim 1, wherein, at the timing when the diameter of the silicon single crystal reaches a predetermined value, difference between the position of the surface of the silicon melt determined by the first operator and the position of the surface of the silicon melt determined by the second operator is calibrated.

\* \* \* \* \*